United States Patent
Hall et al.

(10) Patent No.: US 8,318,577 B2
(45) Date of Patent: Nov. 27, 2012

(54) METHOD OF MAKING A SEMICONDUCTOR DEVICE AS A CAPACITOR

(75) Inventors: Mark D. Hall, Austin, TX (US); Mehul D. Shroff, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/096,528

(22) Filed: Apr. 28, 2011

(65) Prior Publication Data

US 2012/0276705 A1    Nov. 1, 2012

(51) Int. Cl.
*H01L 21/20* (2006.01)
(52) U.S. Cl. ............ 438/386; 438/387; 257/E21.008
(58) Field of Classification Search ............ 438/381, 438/386, 387
See application file for complete search history.

(56) References Cited

U.S. PATENT DOCUMENTS

| | | | |
|---|---|---|---|
| 5,168,073 A | 12/1992 | Gonzalez et al. | |
| 5,442,213 A | 8/1995 | Okudaira et al. | |
| 6,963,483 B2 | 11/2005 | Chakravorty et al. | |
| 6,984,556 B2* | 1/2006 | Drabe et al. .................. | 438/248 |
| 7,129,567 B2 | 10/2006 | Kirby et al. | |
| 7,153,707 B2 | 12/2006 | Fazan et al. | |
| 7,531,420 B2 | 5/2009 | Nirschl et al. | |
| 7,745,867 B2 | 6/2010 | Houston | |
| 2003/0017675 A1* | 1/2003 | Chen et al. ..................... | 438/380 |
| 2005/0208727 A1* | 9/2005 | Lin et al. ........................ | 438/386 |
| 2008/0242021 A1* | 10/2008 | Kwon et al. ................... | 438/243 |
| 2010/0044832 A1* | 2/2010 | Su et al. ......................... | 257/532 |
| 2011/0027962 A1* | 2/2011 | Bernstein et al. ............. | 438/386 |
| 2011/0097869 A1* | 4/2011 | Won et al. ...................... | 438/386 |

OTHER PUBLICATIONS

Thomas, M.E., et al, "VLSI Multilevel Micro-Coaxial Interconnects for High Speed Devices", IEEE, 1990, IEDM, pp. 55-58.

* cited by examiner

*Primary Examiner* — Alexander Ghyka
(74) *Attorney, Agent, or Firm* — James L. Clingan, Jr.; Joanna G. Chiu

(57) ABSTRACT

Forming a capacitor structure includes forming a first dielectric layer over a conductive region, wherein the first dielectric layer has a first conductive layer at a top surface of the first dielectric layer; forming a first opening in the first dielectric layer over the conductive region, wherein the first opening exposes a first sidewall of the first conductive layer; forming a second conductive layer within the first opening, wherein the second conductive layer contacts the first sidewall of the first conductive layer; removing a portion of the second conductive layer from the bottom of the first opening; forming an insulating layer within the first opening; removing a portion of the insulating layer from the bottom of the first opening; extending the first opening through the first dielectric layer to expose the conductive region; and filling the first opening with a conductive material, wherein the conductive material contacts the conductive region.

20 Claims, 8 Drawing Sheets

METHOD OF MAKING A SEMICONDUCTOR DEVICE AS A CAPACITOR

RELATED APPLICATIONS

This application is related to U.S. patent application Ser. No. 13/096,543 titled "SEMICONDUCTOR DEVICE STRUCTURE AS A CAPACITOR," filed concurrently herewith, and assigned to the assignee hereof.

BACKGROUND

1. Field

This disclosure relates generally to capacitors, and more specifically, to capacitors formed as a semiconductor device.

2. Related Art

Capacitors are used in some form in most integrated circuits and thus formed as semiconductor devices. They are used for a variety of purposes including filters, amplifiers, sample and hold, analog to digital converters, storage devices, power supplies, as well as others. A particular use may have a higher importance on precision and other uses may have a higher importance on the magnitude of capacitance. In all cases though, it is beneficial to have small size and ease of routing the connections to and from the capacitor.

Thus, regardless of the application, there is a need for additional advancements in providing a capacitor with more efficient routing and/or size.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a semiconductor device is formed to make a capacitor structure in which the primary capacitance is formed between an inner electrode and an outer electrode that surrounds the inner electrode. The inner electrode has a lower portion that contacts a first conductive region below the inner electrode and an upper portion that contacts a second conductive region above the inner electrode. A conductive path is thereby established between the upper portion and the lower portion. This is better understood by reference to the drawings and the following written description.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
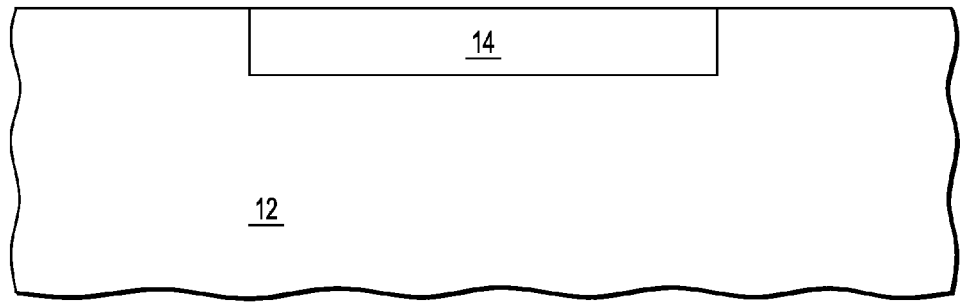
FIG. 1 is a cross section of a semiconductor device according to an embodiment at a stage in processing.

Shown in FIG. 1 is a semiconductor device 10 having a substrate 12 and a conductive region 14 at a top surface of substrate 12. Conductive region 14 may be formed by an implant and may be a portion of a current electrode, such as a source or drain, of a transistor. Conductive region 14 could also be a well tie. Conductive region 14 may also be silicided.

Figure 2:
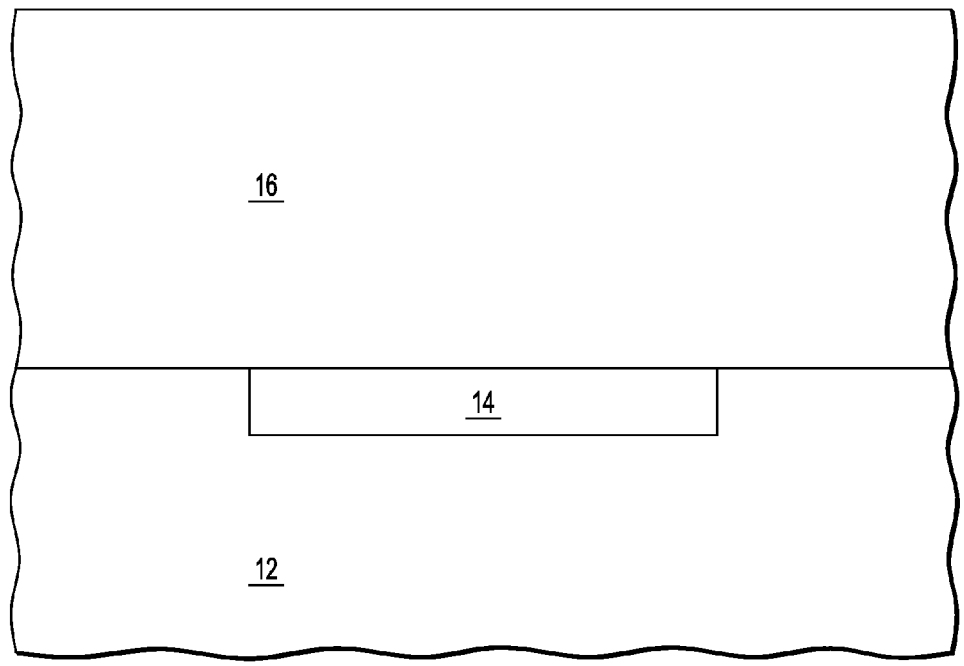
FIG. 2 is a cross section of the semiconductor device of FIG. 1 at a subsequent stage in processing.

Shown in FIG. 2 is semiconductor device 10 after forming an interlayer dielectric (ILD) 16. ILD 16 may be a deposited oxide. ILD 16 may have a thickness of about 3000 to 5000 Angstroms, but may be thinner or thicker.

Figure 3:
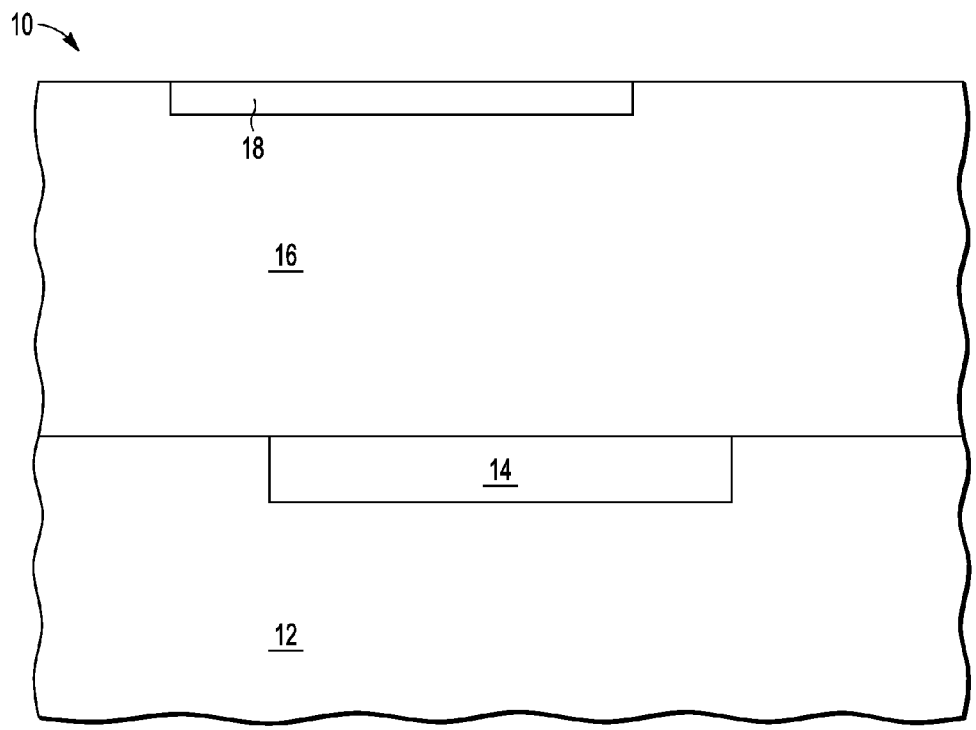
FIG. 3 is a cross section of the semiconductor device of FIG. 2 at a subsequent stage in processing.

Shown in FIG. 3 is semiconductor device 10 after forming a conductive region 18 at a top surface of ILD 16 and having at least a portion over conductive region 14. Conductive region 18 may be formed by forming an opening at the surface of ILD 16, followed by depositing a metal such as tungsten over the surface of ILD 16 which would fill the opening, and then performing chemical mechanical polishing (CMP). The result is a top surface that is planar having conductive region 18 as a portion of the top surface and ILD 16 as a portion of the top surface. An alternative, which results in a somewhat different structure, is to deposit metal and then pattern it to result in a region above ILD 16 with the same shape as conductive region 18. As is typical of depositions of conductive layers, especially ones that contain metal, there may be multiple layers of different conductive layers. For example, a relatively thin barrier layer may be deposited prior to the main deposition that forms most of conductive region 18. The thickness of conductive region 18 may be approximately 500 Angstroms, but it may be thicker or thinner.

Figure 4:
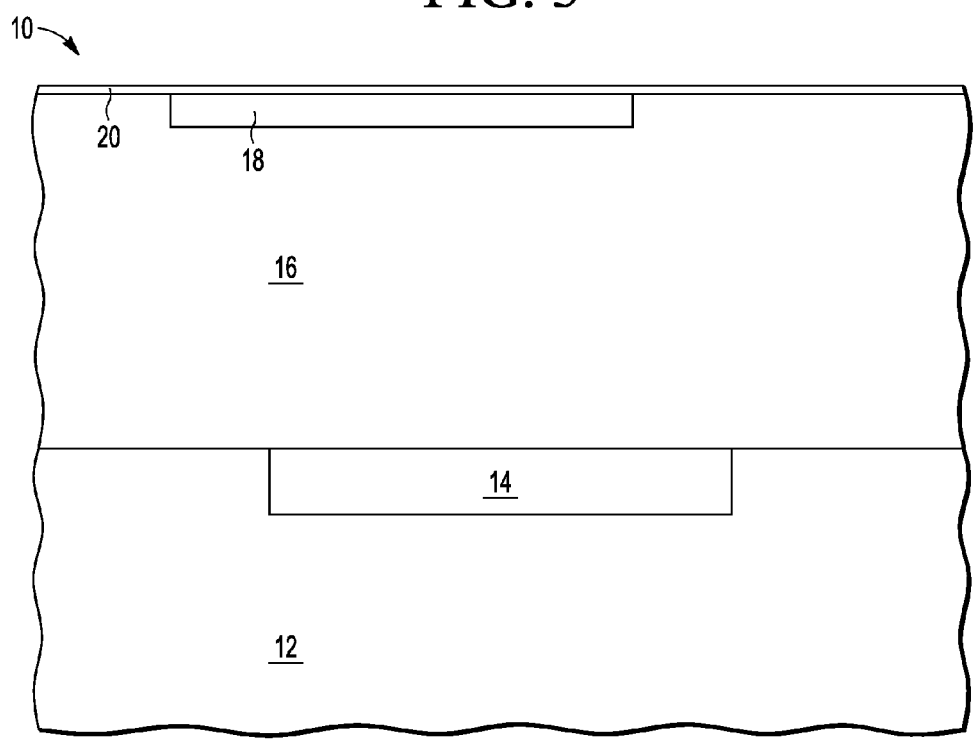
FIG. 4 is a cross section of the semiconductor device of FIG. 3 at a subsequent stage in processing.

Shown in FIG. 4 is semiconductor device 10 after forming a dielectric layer 20 that may be comprised of silicon nitride. Dielectric layer 20 is preferably of a material that can be selectively etched with respect to a conductive layer that is used as an electrode of the capacitor that is in the process of being formed. Dielectric layer 20 may have a thickness of about 100 to 200 Angstroms, but may be thicker or thinner.

Figure 5:
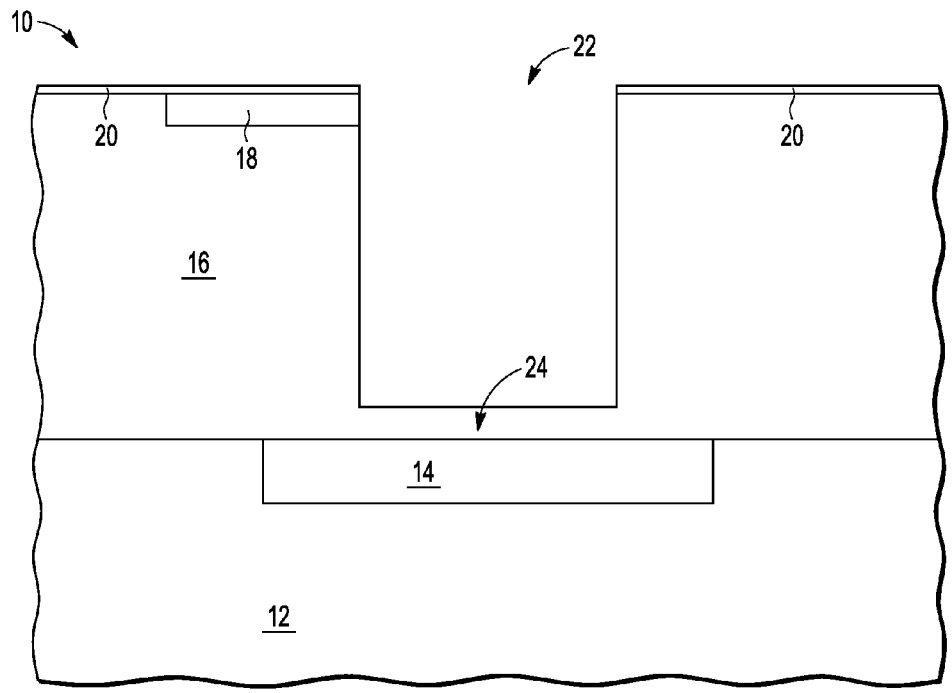
FIG. 5 is a cross section of the semiconductor device of FIG. 4 at a subsequent stage in processing.

Shown in FIG. 5 is semiconductor device 10 after forming an opening 22 in ILD 16 that is over conductive region 14. Opening 22 can vary in width based on the desired capacitance that is to be obtained. Opening 22 has a bottom that is spaced from conductive region 14 by a region 24 in ILD 16. In one embodiment, spacing 24 may be approximately 200 Angstroms thick. Opening 22 is preferably aligned with at least one side of conductive region 18 and leaves a portion of conductive region 18 as shown in FIG. 5. This remaining portion shown in FIG. 5 may be referenced as a contact which will be used as a contact of one of the electrodes of the capacitor that is in the process of being formed. Dielectric layer 20 remains on the top surface of ILD 16 and conductive region 18 but is not otherwise present in opening 22. If the approach of depositing conductive region 18 followed by patterned etch is used instead of the one shown in FIG. 3, then the interface with opening 22 would be the same even though it would extend above the top surface of ILD 16 on the side of conductive region 18 away from opening 22, and the remaining steps may be the same.

Figure 6:
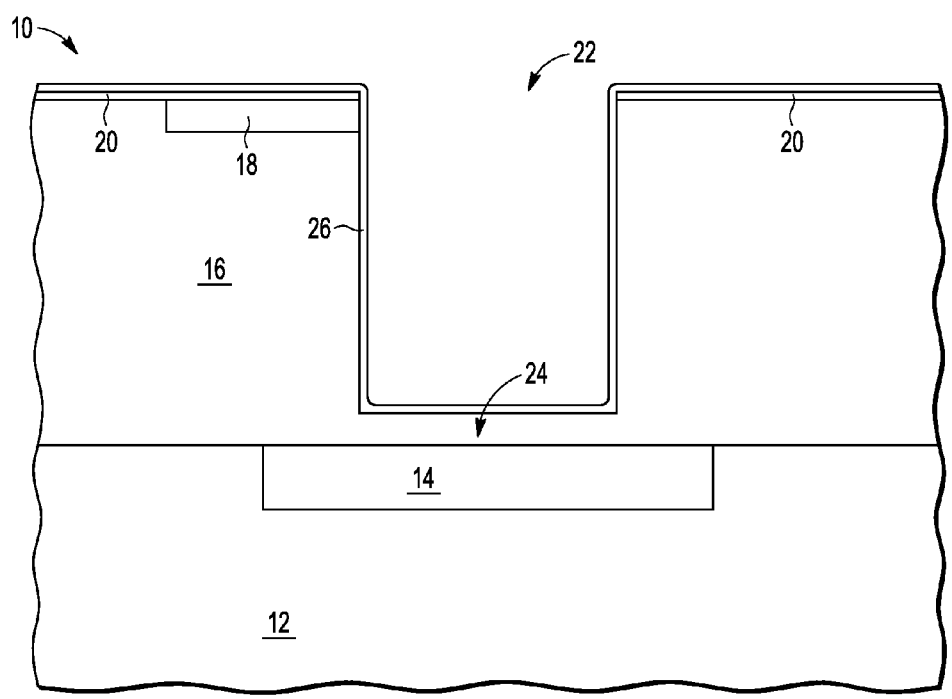
FIG. 6 is a cross section of the semiconductor device of FIG. 5 at a subsequent stage in processing.

Shown in FIG. 6 is semiconductor device 10 after depositing a conductive layer 26 over dielectric layer 20 and in opening 22. This has the affect of conductive layer 26 contacting a lateral edge of conductive region 18 that is exposed at opening 22. Conductive layer 26 may be tantalum nitride.

Figure 7:
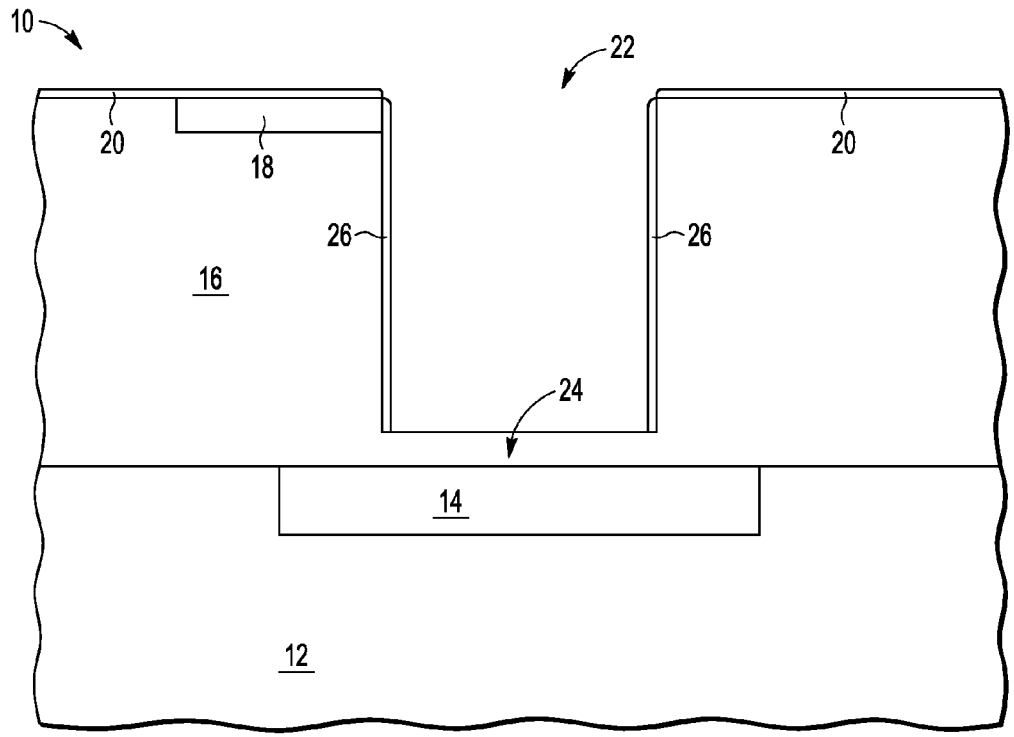
FIG. 7 is a cross section of the semiconductor device of FIG. 6 at a subsequent stage in processing.

Shown in FIG. 7 is semiconductor device 10 after an anisotropic etch that removes conductive layer 26 over dielectric layer 20 and from the bottom of opening 22. This leaves conductive layer 26 on the sidewall of opening 22. Dielectric layer 20 provides an etch stop for this etch of conductive layer 26. This allows for an overetch that ensures that conductive layer 26 is completely removed from over dielectric layer 20 and from the bottom of opening 22 without adversely affecting conductive region 18. This has the effect of reducing the height of conductive layer 26 remaining on the sidewall so that a portion of the side of dielectric layer 20 is exposed where conductive layer 26 is recessed.

Figure 8:
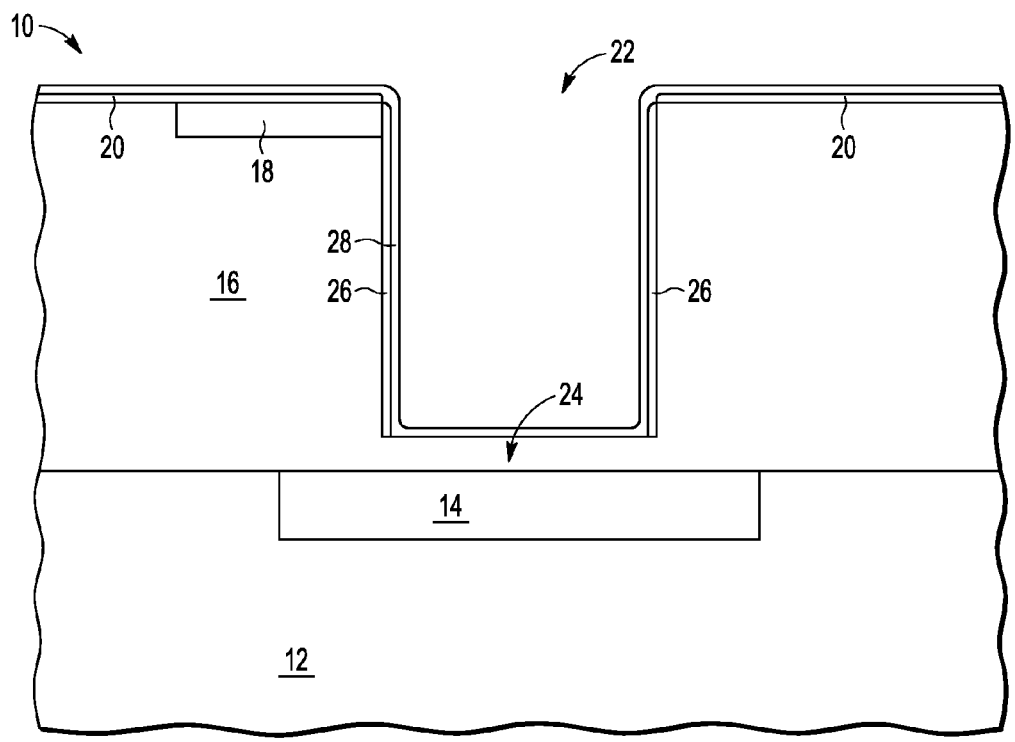
FIG. 8 is a cross section of the semiconductor device of FIG. 7 at a subsequent stage in processing.

Shown in FIG. 8 is semiconductor device 10 after forming a dielectric layer 28 over dielectric layer 20, conductive layer 26, and the bottom of opening 22. Dielectric layer 28 may be a high k dielectric layer such as hafnium oxide for enhancing capacitance. Dielectric layer 28 may have a thickness of about 25 to 100 Angstroms. Due to conductive layer 26 being recessed, dielectric layer 28 is a little thicker at that location. A dielectric layer, including an example such as dielectric layer 28, may also be called an insulating layer.

Figure 9:
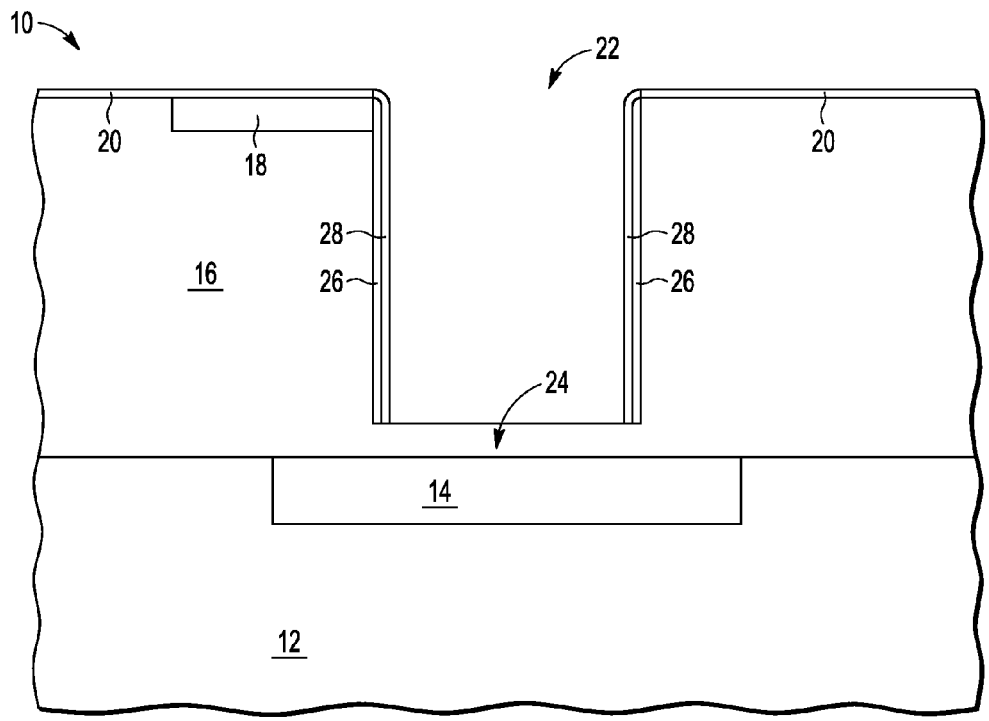
FIG. 9 is a cross section of the semiconductor device of FIG. 8 at a subsequent stage in processing.

Shown in FIG. 9 is semiconductor device 10 after performing an anisotropic etch that removes dielectric layer 28 from over dielectric layer 20 and from the bottom of opening 22. With dielectric layer 28 being a little thicker at the top of conductive layer 26, it may be that conductive layer 26 may not be exposed at that upper location. This may be beneficial but not necessary.

Figure 10:
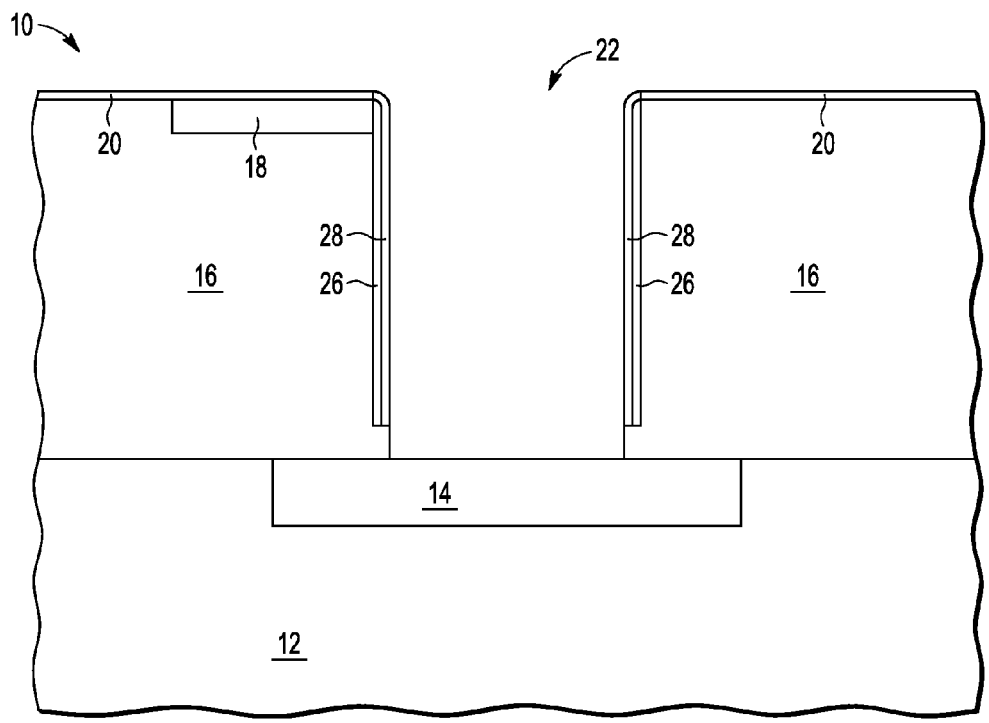
FIG. 10 is a cross section of the semiconductor device of FIG. 9 at a subsequent stage in processing.

Shown in FIG. 10 is semiconductor device 10 after performing an etch of ILD 16 where it is exposed at the bottom of opening 22 to expose conductive region 14. Dielectric layer 28 prevents conductive layer 26 from being exposed except possibly at the top of conductive layer 26. It may be noted that in an alternative embodiment, conductive layer 26 and dielectric layer 28 may be sequentially deposited and then anisotropically etched after both layers are deposited. In such an embodiment, a second deposition of a dielectric layer similar to dielectric layer 28 and subsequent anisotropic etch of the layer may be performed following the etch of ILD 16 to expose conductive region 14.

Figure 11:
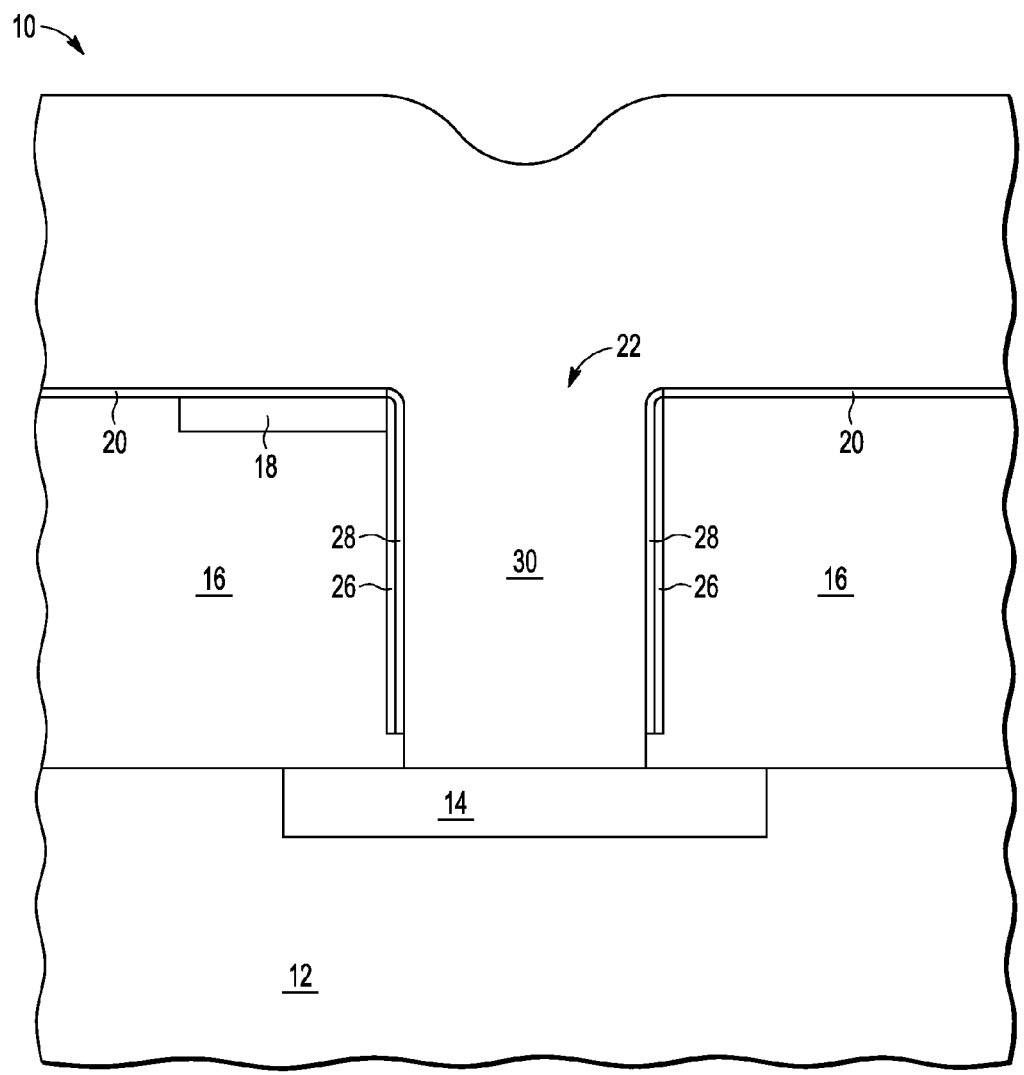
FIG. 11 is a cross section of the semiconductor device of FIG. 10 at a subsequent stage in processing.

Shown in FIG. 11 is semiconductor device 10 after depositing a conductive layer 30 in opening 22 and over dielectric layer 20. Prior to depositing conductive layer 30, regular contacts that do not have associated capacitors are patterned by conventional methods (not shown). Conductive layer 30 may be tungsten with one or more barrier metals. Conductive layer 30 would also fill regular contacts that do not have the associated capacitors.

Figure 12:
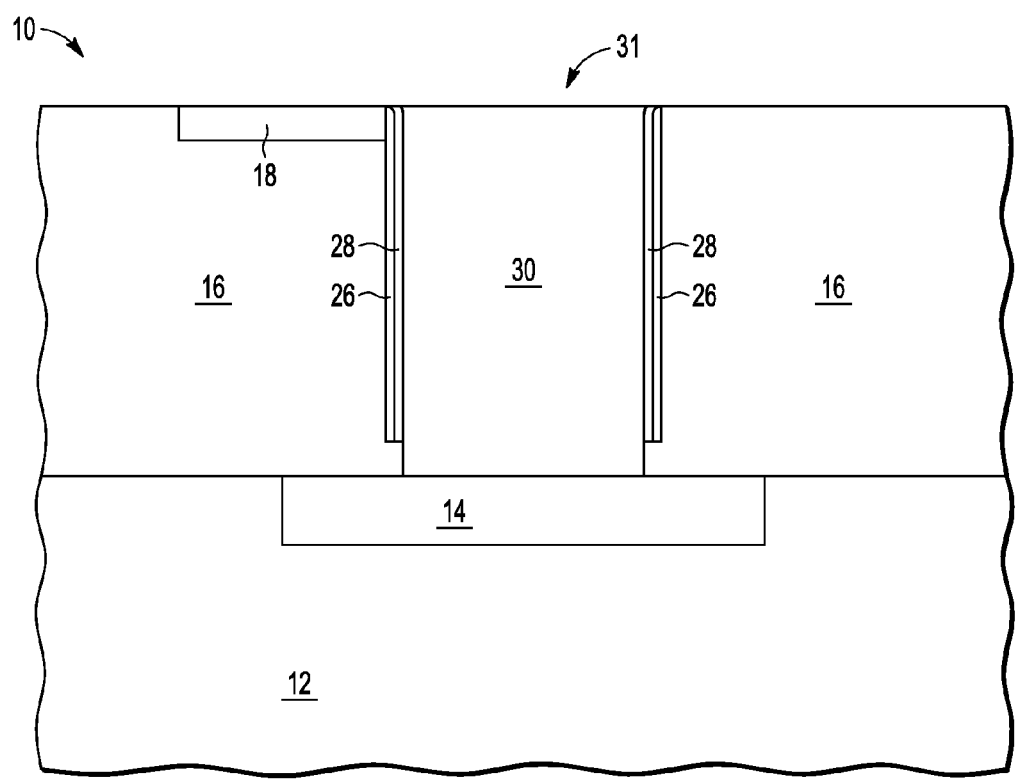
FIG. 12 is a cross section of the semiconductor device of FIG. 11 at a subsequent stage in processing.

Shown in FIG. 12 is semiconductor device 10 after performing CMP on conductive layer 30, dielectric layer 20, and a top portion of conductive region 18 and ILD 16. This removal of the top portion of conductive region 18 and ILD 16 also removes dielectric layer 20 and a top portion of conductive layer 26. The removal of the top portion of conductive layer 26 ensures that even if the top portion of conductive layer 26 was exposed when conductive layer 30 was deposited and thus establishing contact between conductive layer 26 and conductive layer 30, that area of contact would be removed by CMP. The result is that after CMP, conductive layer 26 would not be in contact even if there was physical and thus electrical contact immediately after the deposition of conductive layer 30. Shown in FIG. 12 is a capacitor 31 in which conductive layer 30, which is now contained within opening 22 of FIG. 10, is a first electrode and conductive layer 26, which surrounds conductive layer 30 of FIG. 12, is a second electrode. Dielectric layer 28 separates conductive layer 30 from conductive layer 26. The capacitance of capacitor 31 is proportional to nearly all of the vertical surface area of opening 22. There is a small portion at the bottom of opening 22 where conductive layer 26 does not extend where this is not the case. Also as a result of performing the CMP, dielectric layer 28 has a top surface coplanar with the top surface of dielectric layer 16, and since dielectric layer 28 is within an opening, opening 22, of dielectric layer 16, dielectric layer 28 may be considered to be within dielectric layer 16.

Figure 13:
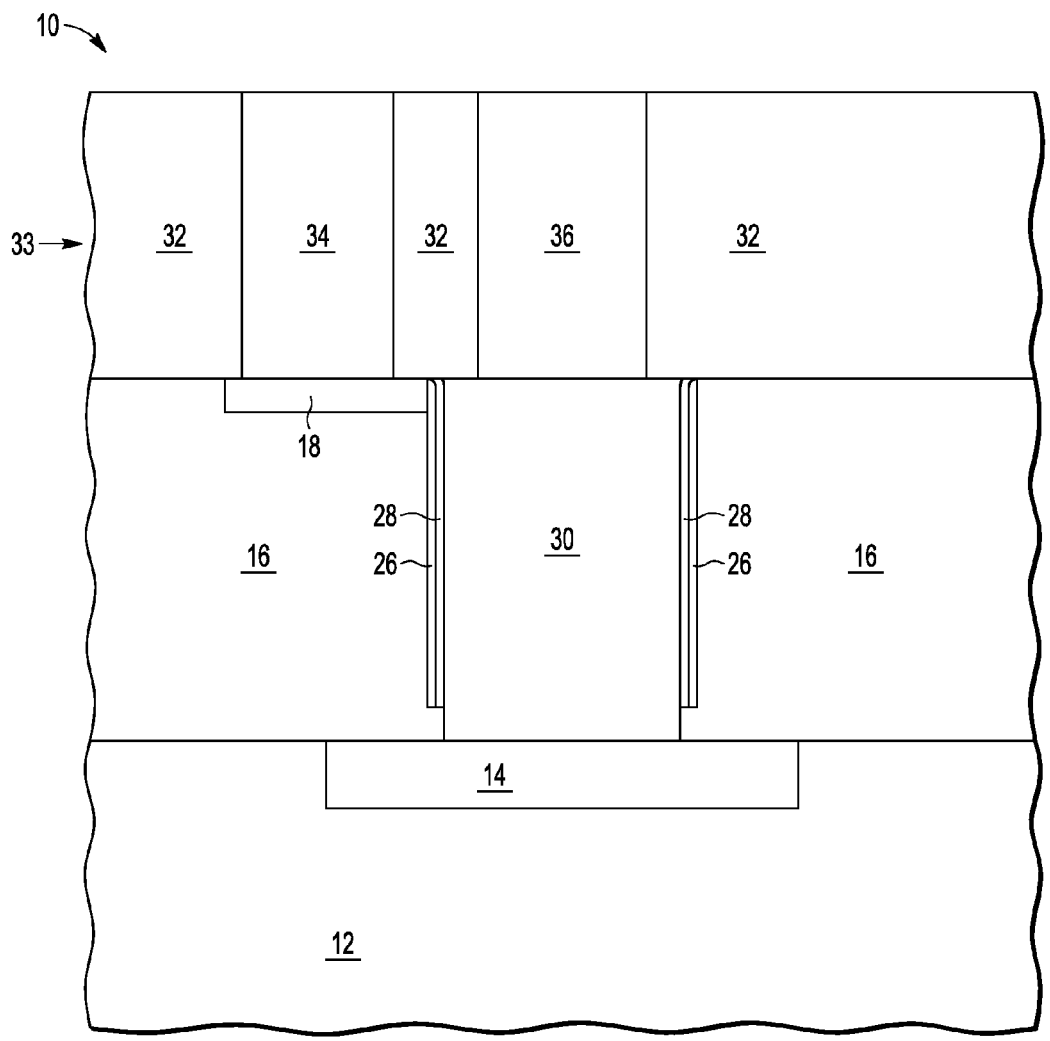
FIG. 13 is a cross section of the semiconductor device of FIG. 12 at a subsequent stage in processing.

Shown in FIG. 13 is an interconnect layer 33 having an ILD 32, an interconnect 34, and an interconnect 36 formed over device structure 10 of FIG. 12. Interconnect 34 extends through ILD 32 to make contact with conductive region 18. Interconnect 36 extends through ILD 32 to contact conductive layer 30. With both interconnect 36 and conductive region 14 in contact with conductive layer 30, interconnect 36 and conductive region 14 are in electrical contact with each other. Thus conductive layer 30, which is the first electrode of capacitor 31, functions also as a conductive path.

Figure 14:
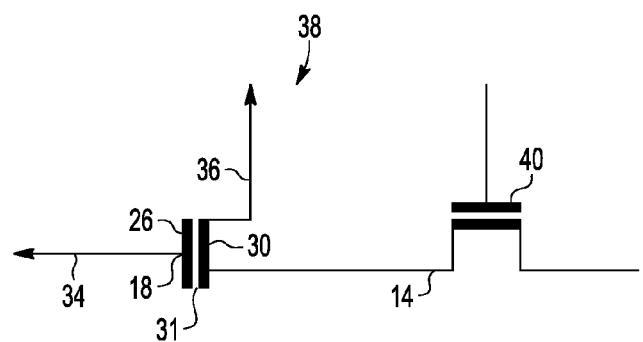
FIG. 14 is a circuit diagram showing a use of the semiconductor device of FIG. 13.

Shown in FIG. 14 is circuit diagram 38 showing a partial circuit having a transistor 40 in which one of its current electrodes, source or drain in this example, is made from region 14 which is in contact with the first electrode, conductive layer 30, of capacitor 31. Interconnect 36 is also in contact with the first electrode. The second electrode of capacitor 31 is conductive layer 26 which is contacted by conductive region 18 which in turn is contacted by interconnect 34.

The structure of capacitor 31 as shown in FIG. 13 provides for an efficient approach for achieving the partial circuit of FIG. 14. The result is that routing is made more efficient while also obtaining high capacitance in a circuit including a capacitor.

By now it should be appreciated that there has been provided a method for forming a capacitor structure. The method includes forming a first dielectric layer over a conductive region, wherein the first dielectric layer has a first conductive layer at a top surface of the first dielectric layer. The method further includes forming a first opening in the first dielectric layer over the conductive region, wherein the first opening exposes a first sidewall of the first conductive layer, wherein a portion of the first dielectric layer remains between a bottom of the first opening and the conductive region, and wherein the first opening has a bottom. The method further includes forming a second conductive layer within the first opening, wherein the second conductive layer contacts the first sidewall of the first conductive layer. The method further includes removing a portion of the second conductive layer from the bottom of the first opening. The method further includes forming an insulating layer within the first opening. The method further includes removing a portion of the insulating layer from the bottom of the first opening. The method further includes extending the first opening through the first dielectric layer to expose the conductive region. The method further includes filling the first opening with a conductive material, wherein the conductive material contacts the conductive region, and wherein the second conductive layer forms a first plate electrode of the capacitor structure and the conductive material forms a second plate electrode of the capacitor structure. The method may have a further characterization by which the step of removing the portion of the second conductive layer from the bottom of the first opening is performed after the step of removing the portion of the insulating layer from the bottom of the first opening. The method may have a further characterization by which the step of removing the portion of the second conductive layer from the bottom of the first opening comprises performing a first anisotropic etch. The method may have a further characterization by which the step of removing the portion of the insulating layer from the bottom of the first opening comprises performing a second anisotropic etch. The method may have a further characterization by which the step of removing the portion of the insulating layer from the bottom of the first opening comprises performing an anisotropic etch. The method may further comprise forming a second dielectric layer over the first dielectric layer, wherein the second dielectric layer has a third conductive layer which contacts the conductive material. The method may have a further characterization by which the step of forming the first dielectric layer having the first conductive layer at the top surface comprises forming a second opening in the first dielectric layer, wherein the second opening does not fully extend through the first dielectric layer and forming the first conductive layer in the second opening. The method may have a further characterization by which the step of forming the first opening is performed such that during the forming of the first opening, a portion of the first conductive layer is removed to expose the first sidewall. The method may have a further characterization by which prior to the step of forming the first dielectric layer, the method further comprises forming the conductive region in a top surface of a semiconductor layer. The method may have a further characterization by which the conductive region comprises a doped region of the semiconductor layer. The method may have a further characterization by which. The method may have a further characterization by which the doped region is a source/drain region of a transistor formed in and on the semiconductor layer. The method may have a further characterization by which the conductive region comprises a metal. The method may have a further characterization by which prior to the step of forming the second conductive layer, the method further comprises forming an etch stop layer over the first conductive layer and the first dielectric layer, wherein the step of removing the portion of the second conductive layer from the bottom of the first opening is performed using the etch stop layer.

Also described is a method for forming a capacitor structure including a first dielectric layer over a conductive region, wherein the first dielectric layer has a first conductive layer at a top surface of the first dielectric layer. The method further includes forming a first opening in the first dielectric layer over the conductive region, wherein the first opening exposes a first sidewall of the first conductive layer and wherein a portion of the first dielectric layer remains between a bottom of the first opening and the conductive region. The method further includes forming a second conductive layer within the first opening, wherein the second conductive layer contacts the first sidewall of the first conductive layer. The method further includes etching the second conductive layer to remove a portion of the second conductive layer from the bottom of the first opening and leave a remaining portion of the second conductive layer adjacent a sidewall of the first opening. The method further includes forming an insulating layer within the first opening. The method further includes forming an insulating layer within the first opening. The method further includes etching the insulating layer to remove a portion of the insulating layer from the bottom of the first opening and leave a remaining portion of the insulating layer adjacent the sidewall of the first opening, wherein the remaining portion of the second conductive layer is between the sidewall of the first opening and the remaining portion of the insulating layer. The method further includes extending the first opening through the first dielectric layer to expose the conductive region. The method further includes filling the first opening with a conductive material, wherein the conductive material contacts the conductive region, and wherein the second conductive layer forms a first plate electrode of the capacitor structure and the conductive material forms a second plate electrode of the capacitor structure. The method may further comprise forming a second dielectric layer over the first dielectric layer, wherein the second dielectric layer has a third conductive layer which contacts the conductive material. The method may have a further characterization by which the conductive region comprises a doped region formed in a semiconductor layer. The method may have a further characterization by which the doped region is one of a source/drain region of a transistor formed in and on the semiconductor layer, a well tie region, or a gate region of a transistor formed in and on the semiconductor layer. The method may have a further characterization by which the doped region comprises a metal.

Also described is a method for forming a capacitor structure forming a first dielectric layer over a conductive region, wherein the first dielectric layer has a first conductive layer at a top surface of the first dielectric layer, and wherein the conductive region is selected from a group consisting of a doped region of a semiconductor layer and a metal. The method further includes forming an etch stop layer over the first conductive layer and the first dielectric layer. The method further includes forming a first opening in the first dielectric layer over the conductive region, wherein the first opening exposes a first sidewall of the first conductive layer and wherein a portion of the first dielectric layer remains between a bottom of the first opening and the conductive region. The method further includes forming a second conductive layer within the first opening, wherein the second conductive layer contacts the first sidewall of the first conductive layer. The method further includes using the etch stop layer to etch the second conductive layer to remove a portion of the second conductive layer from the bottom of the first opening and leave a remaining portion of the second conductive layer adjacent a sidewall of the first opening. The method further includes forming an insulating layer within the first opening. The method further includes etching the insulating layer to remove a portion of the insulating layer from the bottom of the first opening and leave a remaining portion of the insulating layer adjacent the sidewall of the first opening, wherein the remaining portion of the second conductive layer is between the sidewall of the first opening and the remaining portion of the insulating layer. The method further includes extending the first opening through the first dielectric layer to expose the conductive region. The method further includes filling the first opening with a conductive material, wherein the conductive material contacts the conductive region, and wherein the second conductive layer forms a first plate electrode of the capacitor structure and the conductive material forms a second plate electrode of the capacitor structure. The method may further comprise forming a second dielectric layer over the first dielectric layer, wherein the second dielectric layer has a third conductive layer which contacts the conductive material and a fourth conductive layer which contacts the first conductive layer.

Although the invention is described herein with reference to specific embodiments, various modifications and changes can be made without departing from the scope of the present invention as set forth in the claims below. For example different materials may be used than those described. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a capacitor structure, the method comprising:
    forming a first dielectric layer over a conductive region, wherein the first dielectric layer has a first conductive layer at a top surface of the first dielectric layer;
    forming a first opening in the first dielectric layer over the conductive region, wherein the first opening exposes a first sidewall of the first conductive layer, wherein a portion of the first dielectric layer remains between a bottom of the first opening and the conductive region, and wherein the first opening has a bottom;
    forming a second conductive layer within the first opening, wherein the second conductive layer contacts the first sidewall of the first conductive layer;
    removing a portion of the second conductive layer from the bottom of the first opening;
    forming an insulating layer within the first opening;
    removing a portion of the insulating layer from the bottom of the first opening;
    extending the first opening through the first dielectric layer to expose the conductive region; and
    filling the first opening with a conductive material, wherein the conductive material contacts the conductive region, and wherein the second conductive layer forms a first plate electrode of the capacitor structure and the conductive material forms a second plate electrode of the capacitor structure.

2. The method of claim 1, wherein the step of removing the portion of the second conductive layer from the bottom of the first opening is performed after the step of removing the portion of the insulating layer from the bottom of the first opening.

3. The method of claim 1, wherein the step of removing the portion of the second conductive layer from the bottom of the first opening comprises:
    performing a first anisotropic etch.

4. The method of claim 3, wherein the step of removing the portion of the insulating layer from the bottom of the first opening comprises:
    performing a second anisotropic etch.

5. The method of claim 1, wherein the step of removing the portion of the insulating layer from the bottom of the first opening comprises:
    performing an anisotropic etch.

6. The method of claim 1, further comprising:
    forming a second dielectric layer over the first dielectric layer, wherein the second dielectric layer has a third conductive layer which contacts the conductive material.

7. The method of claim 1, wherein the step of forming the first dielectric layer having the first conductive layer at the top surface comprises:
    forming a second opening in the first dielectric layer, wherein the second opening does not fully extend through the first dielectric layer; and
    forming the first conductive layer in the second opening.

8. The method of claim 7, wherein the step of forming the first opening is performed such that during the forming of the first opening, a portion of the first conductive layer is removed to expose the first sidewall.

9. The method of claim 1, wherein prior to the step of forming the first dielectric layer, the method further comprises:
    forming the conductive region in a top surface of a semiconductor layer.

10. The method of claim 9, wherein the conductive region comprises a doped region of the semiconductor layer.

11. The method of claim 10, wherein the doped region is a source/drain region of a transistor formed in and on the semiconductor layer.

12. The method of claim 1, wherein the conductive region comprises a metal.

13. The method of claim 1, wherein prior to the step of forming the second conductive layer, the method further comprises:
    forming an etch stop layer over the first conductive layer and the first dielectric layer, wherein the step of removing the portion of the second conductive layer from the bottom of the first opening is performed using the etch stop layer.

14. A method for forming a capacitor structure, the method comprising:
    forming a first dielectric layer over a conductive region, wherein the first dielectric layer has a first conductive layer at a top surface of the first dielectric layer;
    forming a first opening in the first dielectric layer over the conductive region, wherein the first opening exposes a first sidewall of the first conductive layer and wherein a portion of the first dielectric layer remains between a bottom of the first opening and the conductive region;
    forming a second conductive layer within the first opening, wherein the second conductive layer contacts the first sidewall of the first conductive layer;
    etching the second conductive layer to remove a portion of the second conductive layer from the bottom of the first opening and leave a remaining portion of the second conductive layer adjacent a sidewall of the first opening;
    forming an insulating layer within the first opening;
    etching the insulating layer to remove a portion of the insulating layer from the bottom of the first opening and leave a remaining portion of the insulating layer adjacent the sidewall of the first opening, wherein the remaining portion of the second conductive layer is between the sidewall of the first opening and the remaining portion of the insulating layer;
    extending the first opening through the first dielectric layer to expose the conductive region; and filling the first opening with a conductive material, wherein the conductive material contacts the conductive region, and wherein the second conductive layer forms a first plate electrode of the capacitor structure and the conductive material forms a second plate electrode of the capacitor structure.

15. The method of claim 14, further comprising:
forming a second dielectric layer over the first dielectric layer, wherein the second dielectric layer has a third conductive layer which contacts the conductive material.

16. The method of claim 14, wherein the conductive region comprises a doped region formed in a semiconductor layer.

17. The method of claim 16, wherein the doped region is one of a source/drain region of a transistor formed in and on the semiconductor layer, a well tie region, or a gate region of a transistor formed in and on the semiconductor layer.

18. The method of claim 14, wherein the conductive region comprises a metal.

19. A method for forming a capacitor structure, the method comprising:
forming a first dielectric layer over a conductive region, wherein the first dielectric layer has a first conductive layer at a top surface of the first dielectric layer, and wherein the conductive region is selected from a group consisting of a doped region of a semiconductor layer and a metal;
forming an etch stop layer over the first conductive layer and the first dielectric layer;
forming a first opening in the first dielectric layer over the conductive region, wherein the first opening exposes a first sidewall of the first conductive layer and wherein a portion of the first dielectric layer remains between a bottom of the first opening and the conductive region;
forming a second conductive layer within the first opening, wherein the second conductive layer contacts the first sidewall of the first conductive layer;
using the etch stop layer to etch the second conductive layer to remove a portion of the second conductive layer from the bottom of the first opening and leave a remaining portion of the second conductive layer adjacent a sidewall of the first opening;
forming an insulating layer within the first opening;
etching the insulating layer to remove a portion of the insulating layer from the bottom of the first opening and leave a remaining portion of the insulating layer adjacent the sidewall of the first opening, wherein the remaining portion of the second conductive layer is between the sidewall of the first opening and the remaining portion of the insulating layer;
extending the first opening through the first dielectric layer to expose the conductive region; and
filling the first opening with a conductive material, wherein the conductive material contacts the conductive region, and wherein the second conductive layer forms a first plate electrode of the capacitor structure and the conductive material forms a second plate electrode of the capacitor structure.

20. The method of claim 19, further comprising:
forming a second dielectric layer over the first dielectric layer, wherein the second dielectric layer has a third conductive layer which contacts the conductive material and a fourth conductive layer which contacts the first conductive layer.

* * * * *